(12) United States Patent
Tanaka

(10) Patent No.: US 9,281,657 B2
(45) Date of Patent: Mar. 8, 2016

(54) APPARATUS FOR OUTPUT LIGHT WITH WAVELENGTH TUNABLE FUNCTION AND METHOD TO DETERMINE OSCILLATION WAVELENGTH OF WAVELENGTH TUNABLE LASER DIODE

(71) Applicant: Sumitomo Electric Device Innovations, Inc., Yokohama-shi (JP)

(72) Inventor: Hirokazu Tanaka, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/303,357

(22) Filed: Jun. 12, 2014

(65) Prior Publication Data

US 2014/0369369 A1 Dec. 18, 2014

(30) Foreign Application Priority Data

Jun. 13, 2013 (JP) ................................. 2013-124866

(51) Int. Cl.

| H01S 3/10 | (2006.01) |
|---|---|
| *H01S 5/0625* | (2006.01) |
| *H01S 5/0683* | (2006.01) |
| *H01S 5/0687* | (2006.01) |
| H01S 5/024 | (2006.01) |
| H01S 5/028 | (2006.01) |
| H01S 5/06 | (2006.01) |
| H01S 5/343 | (2006.01) |

(52) U.S. Cl.
CPC ........... *H01S 5/06258* (2013.01); *H01S 5/0687* (2013.01); *H01S 5/06837* (2013.01); *H01S 5/0287* (2013.01); *H01S 5/02415* (2013.01); *H01S 5/0617* (2013.01); *H01S 5/3434* (2013.01); *H01S 5/34373* (2013.01)

(58) Field of Classification Search
CPC ..... H01S 3/107; H01S 5/02438; H01S 3/106; H01S 3/07; H01S 3/08027; H01S 5/0078
USPC .......................................................... 372/20
See application file for complete search history.

(56) References Cited

U.S. PATENT DOCUMENTS

| 5,438,579 | A * | 8/1995 | Eda et al. .......................... 372/34 |
|---|---|---|---|
| 2009/0168817 | A1* | 7/2009 | Ishikawa et al. ................. 372/20 |
| 2009/0251684 | A1* | 10/2009 | Arai et al. ........................ 356/43 |
| 2011/0158643 | A1* | 6/2011 | Yamazaki ........................ 398/38 |
| 2011/0200062 | A1* | 8/2011 | Shibata et al. ................... 372/20 |
| 2012/0301152 | A1* | 11/2012 | Edwards et al. ............... 398/135 |
| 2013/0003762 | A1* | 1/2013 | Kaneko ........................... 372/20 |
| 2013/0070795 | A1* | 3/2013 | Ikagawa et al. ................. 372/20 |

FOREIGN PATENT DOCUMENTS

JP 07-273400 10/1995

* cited by examiner

*Primary Examiner* — Xinning Niu
*Assistant Examiner* — Vu A Vu
(74) *Attorney, Agent, or Firm* — Venable LLP; Michael A. Sartori; F. Brock Riggs

(57) ABSTRACT

An apparatus for output light with a wavelength tunable function, includes: a semiconductor laser diode (LD) including regions to determine an oscillation wavelength, the regions providing respective diffraction gratings and electrodes to control refractive index of the regions; a temperature controller for mounting the LD thereon to control a temperature of the LD; and a controller configured to vary the refractive index of the regions by providing control signals to the electrodes and another control signal to the temperature controller for varying the temperature of the LD to coincide the oscillation wavelength with a target wavelength.

13 Claims, 9 Drawing Sheets

FIG. 5

| Ch | INITIAL SETTING VALUE ||||| FEEDBACK CONTROL TARGET ||
| --- | --- | --- | --- | --- | --- | --- | --- |
| | $I_G$ | $T_{TEC1}$ | $T_{TEC2}$ | $P_{SG1}$ | $P_{SG2}$ | $I_{m1}$ | $I_{m2}/I_{m1}$ |
| 1 | $I_{LD1}$ | | | $P1_1$ | $P2_1$ | $I_{m1-1}$ | A1 |
| 2 | $I_{LD2}$ | | | $P1_2$ | $P2_2$ | $I_{m1-2}$ | A2 |
| 3 | $I_{LD3}$ | | | $P1_3$ | $P2_3$ | $I_{m1-3}$ | A3 |
| . | . | $T_{LD1}$ | $T_{ETALON}$ | . | . | . | . |
| . | . | | | . | . | . | . |
| . | . | | | . | . | . | . |
| n | $I_{LDn}$ | | | $P1_n$ | $P2_n$ | $I_{m1-n}$ | An |

FIG. 6

| Ch | INITIAL SETTING VALUE | | | | | FEEDBACK CONTROL TARGET | |
|---|---|---|---|---|---|---|---|
| | $I_G$ | $T_{TEC1}$ | $T_{TEC2}$ | $P_{SG1}$ | $P_{SG2}$ | $I_{m1}$ | $I_{m2}/I_{m1}$ |
| 1 | $I_{LD1}$ | $T_{LD1}$ | | $P1_1$ | $P2_1$ | $I_{m1-1}$ | A1 |
| 2 | $I_{LD2}$ | $T_{LD2}$ | | $P1_2$ | $P2_2$ | $I_{m1-2}$ | A2 |
| 3 | $I_{LD3}$ | $T_{LD3}$ | | $P1_3$ | $P2_3$ | $I_{m1-3}$ | A3 |
| . | . | . | $T_{ETALON}$ | . | . | . | . |
| . | . | . | | . | . | . | . |
| . | . | . | | . | . | . | . |
| n | $I_{LDn}$ | $T_{LDn}$ | | $P1_n$ | $P2_n$ | $I_{m1-n}$ | An |

APPARATUS FOR OUTPUT LIGHT WITH WAVELENGTH TUNABLE FUNCTION AND METHOD TO DETERMINE OSCILLATION WAVELENGTH OF WAVELENGTH TUNABLE LASER DIODE

CROSS-REFERENCE TO RELATED APPLICATION

This application is based upon and claims the benefit of priority of the prior Japanese Patent Application No. 2013-124866, filed on Jun. 13, 2013, the entire contents of which are incorporated herein by reference.

BACKGROUND (i) Technical Field

The present application relates to an apparatus for output light with wavelength tunable function and a method to determine an oscillation wavelength of a wavelength tunable laser diode.

(ii) Related Art

A plurality of methods are known as a technique to control a wavelength of light output from a tunable semiconductor laser diode (hereafter denoted as LD). A typical wavelength tunable LD has a plurality of portions to tune the wavelength of the light each inherently having a periodical reflection (or gain) peak spectrum. Peak wavelengths in the reflection spectrum attributed to one of portions and those of the gain spectrum attributed to another portion are different from each other. A laser oscillation occurs at the wavelength where the peak wavelength of the reflection spectrum coincides with the peak wavelength of the gain spectrum. Japanese Patent Application Publication No. 7-273400 discloses that a sampled grating (SG) is used as the wavelength selection portion.

SUMMARY

Fine accuracy in various parameters and conditions is required to control the wavelength of a tunable LD. However, stable laser oscillation at a target wavelength is sometimes hard depending on operating conditions of the wavelength tunable LD and/or performance of a controller to drive the wavelength tunable LD.

It is an object of the present application to provide an apparatus for output light with a wavelength tunable function that is capable of achieving a stable laser oscillation at a target wavelength.

According to an aspect of the present invention, an apparatus for output light with a wavelength tunable function includes a semiconductor laser diode (LD) having regions to determine an oscillation wavelength of the LD, the regions providing respective diffraction gratings and electrodes to control refractive index of the regions; a temperature controller for mounting the LD thereon to control a temperature of the LD; and a controller configured to vary the refractive index of the regions by providing control signals to the electrodes and another control signal to the temperature controller for varying the temperature of the LD to coincide the oscillation wavelength of the LD with a target wavelength.

According to another aspect of the present invention, an apparatus for output light with a wavelength tunable function including: a semiconductor laser diode (LD) including regions having respective diffraction gratings therein and respective electrodes on the regions, the electrodes controlling respective refractive index of the regions; a first temperature controller that mounts the LD thereon to control a temperature of the LD; an etalon filter optically coupled with the LD; a second temperature controller that mounts the etalon filter thereon.

Still another aspect of the present application relates to a method to determine an oscillation wavelength of a wavelength tunable laser diode (LD). The wavelength tunable LD includes regions having respective diffraction gratings therein and respective electrodes on the regions, the regions showing spectra specific thereto including a plurality of peaks. The method comprises steps of: (a) providing control signals to respective electrodes to determine an oscillation wavelength at which one of peaks of one of regions coincides with one of peaks of another of regions; and (b) providing another control signal to a temperature controller that mounts the wavelength tunable LD thereon, the another control signal varying a temperature of the LD such that the oscillation wavelength of the wavelength tunable LD becomes substantially equal to a target wavelength.

BRIEF DESCRIPTION OF THE DRAWINGS

FIG. 5 illustrates a structure of a data table storing a parameter;

FIG. 6 illustrates a structure of a data table storing a parameter;

DETAILED DESCRIPTION

Next, some embodiments according to the present invention will be described.

First Embodiment

Figure 1:
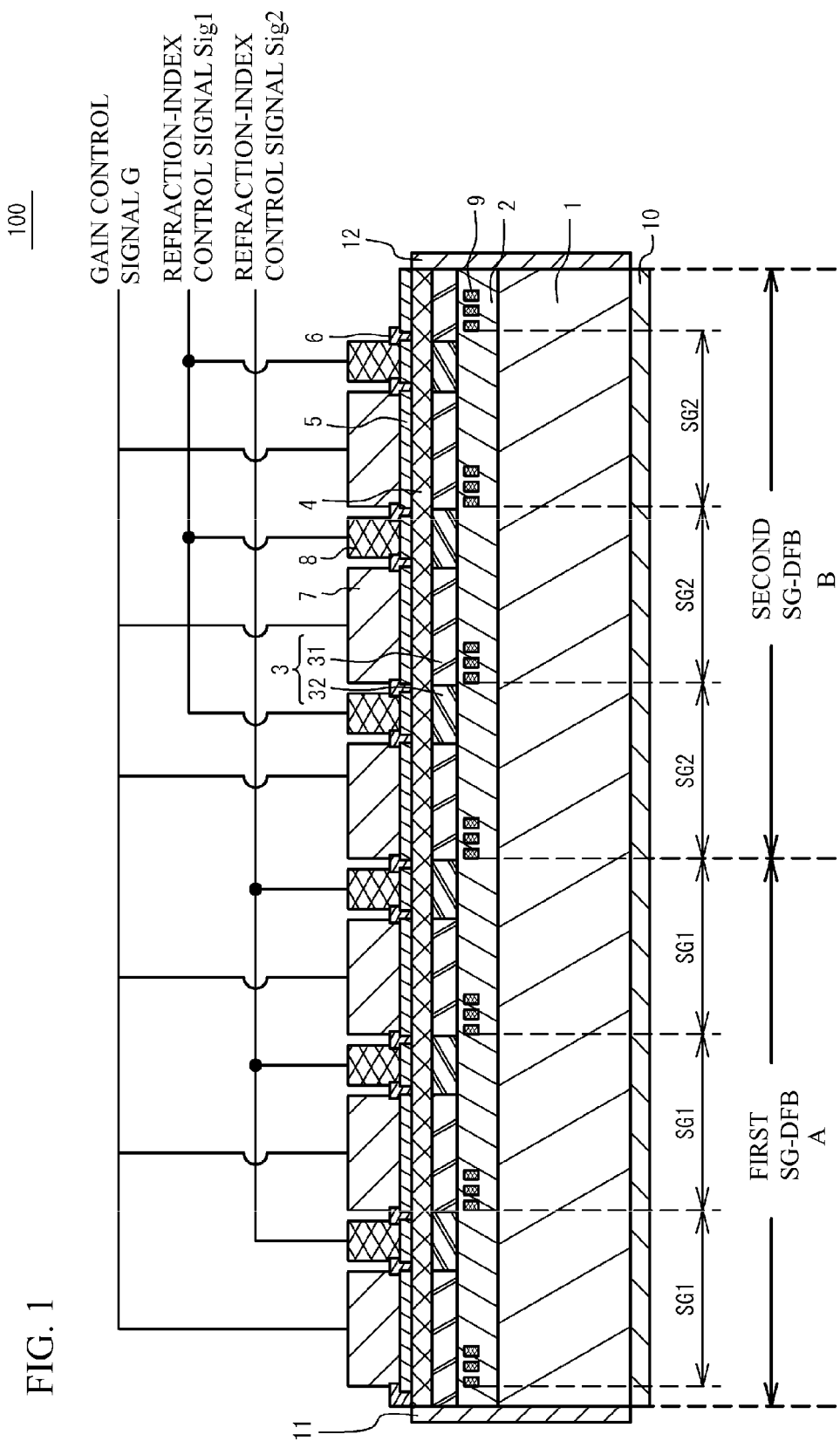
FIG. 1 illustrates a schematic cross sectional view of an overall structure of a semiconductor laser in accordance with a first embodiment.

FIG. 1 schematically illustrates a cross section of an overall structure of a wavelength tunable LD 100 in accordance with a first embodiment. As illustrated in FIG. 1, the wavelength tunable LD 100 includes a first SG-DFB (Sampled Grating Distributed Feedback) region A and a second SG-DFB region B optically coupled to the first SG-DFB region. In the wavelength tunable LD 100, two SG-DFB regions, A and B, form an optical cavity for the laser oscillating.

The first SG-DFB region A and the second SG-DFB region B include a lower cladding layer 2, a waveguide core 3, an upper cladding layer 4 and a contact layer 5, where these layers are stacked in this order on a substrate 1. The waveguide core 3 includes a plurality of gain regions 31 and a plurality of tuning regions 32 where those regions, 31 and 32, are alternately arranged along a light propagating direction. Each of the tuning regions 32 is able to modify the refractive index thereof. The contact layer 5 is divided at an interface between the gain region 31 and the tuning region 32. An insulating film 6 fills a gap formed between divided contact layers 5. An electrode 7 to control a gain is formed on the contact layer 5 provided above the gain region 31; while, another electrode 8 to modify the refractive index is formed on the contact layer 5 above the tuning region 32.

A diffraction grating 9 is formed in portions of the lower cladding layer 2 below the gain region 31. Each of the diffraction gratings 9 is discretely formed with a predetermined interval. The diffraction grating 9 in the embodiment has a structure where regions having relatively lower refractive index and other regions having relatively higher refractive index are alternately arranged. A concave-convex portion may be formed at an interface between a high-refractive index layer and a low-refractive index layer. A region including the diffraction grating 9 and a space sandwiched by two diffraction gratings 9 is referred to a segment in the present specification.

In the embodiment, the side, where the first SG-DFB region A is provided, is referred to the front side, while, the other side, where the second SG-DFB region B is provided, is referred to the rear side. The substrate 1, the lower cladding layer 2, the waveguide core 3 and the upper cladding layer 4 are commonly provided in both of the first SG-DFB region A and the second SG-DFB region B.

An AR (Anti Reflection) film 11 is provided on a facet of the substrate 1, that of the lower cladding layer 2, that of the waveguide core 3 and that of the upper cladding layer 4 of the first SG-DFB region A. That is, the AR film 11 is provided on the front side facet of the wavelength tunable LD 100. An AR film 12 is provided on a facet of the substrate 1, that of the lower cladding layer 2, that of the waveguide core 3 and that of the upper cladding layer 4 of the second SG-DFB region B. That is, the AR film 12 is provided on the rear side facet of the wavelength tunable LD 100. A back electrode 10 is provided on the back surface of the substrate 1. The back electrode 10 on the back surface extends in both of the first SG-DFB region A and the second SG-DFB region B.

The substrate 1 is made of, for example, a single crystal of InP. The lower cladding layer 2 and the upper cladding layer 4 are, for example, made of InP, and shows a function of the current blocking and confinement of a laser light traveling backward and forward in the waveguide core 3. The gain region 31 of the waveguide core 3 has an active layer with a multiple quantum well (MQW) structure including a plurality of well layers made of $Ga_{0.32}In_{0.68}As_{0.92}P_{0.08}$ and a plurality of barrier layers made of $Ga_{0.22}In_{0.78}As_{0.47}P_{0.53}$ alternately stacked to each other. The tuning region 32 of the waveguide core 3, which is an optically inactive layer, includes a waveguide layer made of $Ga_{0.28}In_{0.72}As_{0.61}P_{0.39}$. The contact layer 5 is made of $Ga_{0.47}In_{0.53}As$.

Layers described above may be formed by an ordinary technique to grow semiconductor material epitaxially such as an MOCVD technique. The structure including the diffraction grating and the space may be formed by an interference exposure and subsequent photolithography processes. The insulating film 6 is a passivation film made of inorganic materials typically SiN, SiO2, or the like. The electrode 7 to control the gain and another electrode 8 to tune the refractive index are made of metal such as Au. The AR films, 11 and 12, have reflectivity of 0.3% or less, and are made of dielectric films including MgF2 and TiON. Here, the reflectivity of the AR films, 11 and 12, corresponds to those for the light attributed to the wavelength tunable LD 100. When a current is injected into the tuning region 32, the change of 1.5% or so in the equivalent refractive index thereof may be induced.

Each segment SG1 in the first SG-DFB region A has an optical length substantially same to each other. Each segment SG2 in the second SG-DFB region B also has an optical length substantially same to each other; but different from the optical length of the segment SG1. Peak wavelengths attributed to the segment SG1 and peak wavelengths attributed to the segment SG2 may be modified by providing a control signal Sig1 to the electrode 8 in the first SG-DFB region A and another control signal Sig2 to the electrode 8 in the second SG-DFB region B. A laser oscillation occurs at the wavelength where one of the peak wavelengths attributed to the segment SG1 coincides with one of the peak wavelengths attributed to the segment SG2. Another control signal G supplied to the electrode 7 of the first SG-DFB region A and to the second SG-DFB region B may adjust the optical gain of the wavelength tunable LD 100.

Figure 2:
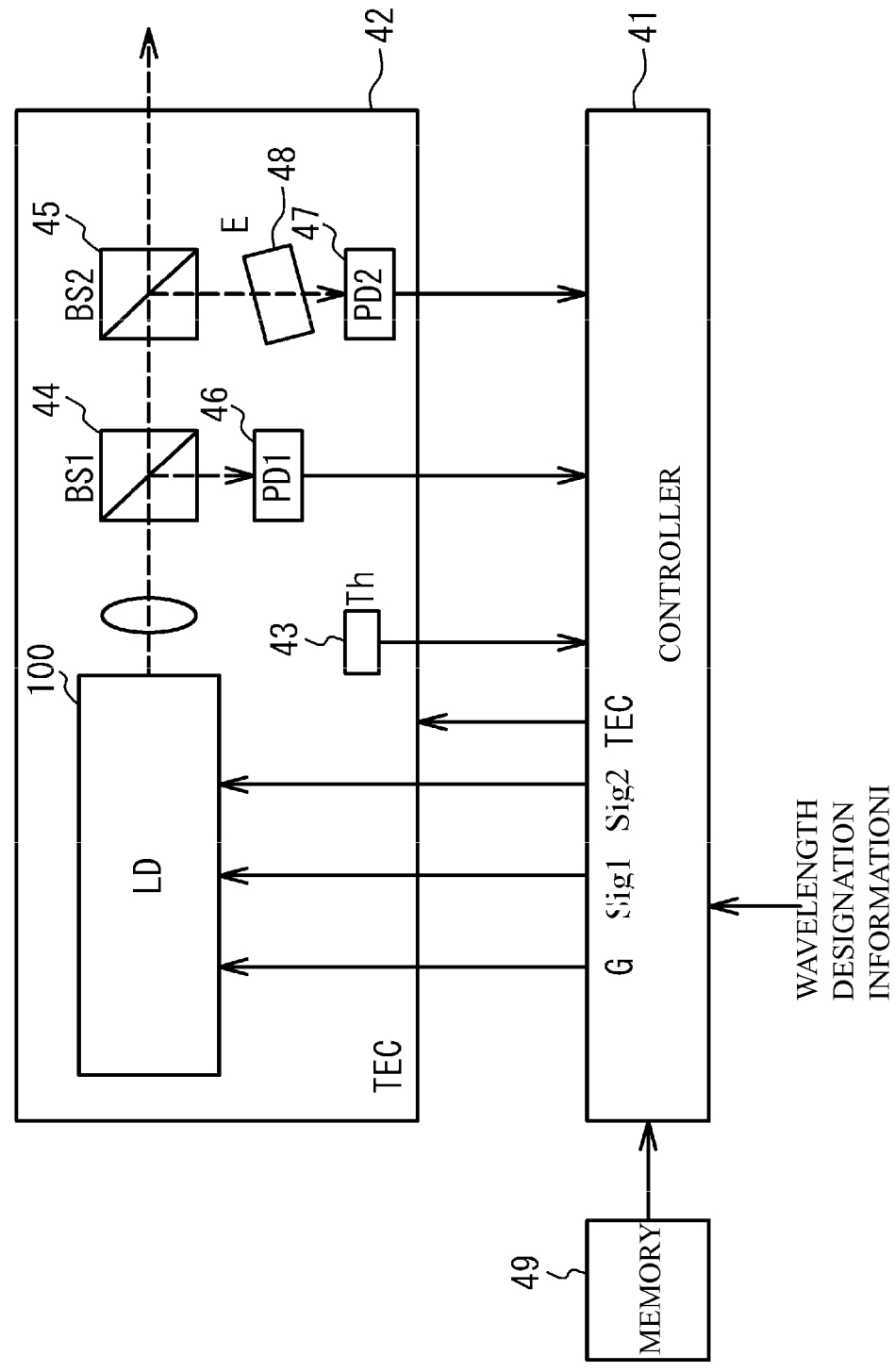
FIG. 2 illustrates an overall system structure of an apparatus for output light with a tunable wavelength in accordance with a comparative example.

FIG. 2 illustrates an overall diagram of an apparatus 201 to output light with a tunable wavelength in accordance with a comparative example. The apparatus 201 has a controller 41, a temperature controller 42, a thermistor 43, beam splitters 44 and 45, two photodiodes (PDs) 46 and 47, an etalon filter 48, a memory 49 and so on.

The controller 41 includes a Central Processing Unit (CPU), a Random Access Memory (RAM), a power supply and so on. The RAM temporarily stores a program executed by the CPU, a data the CPU processes and so on. The memory 49 is rewritable memory, such as a flash memory or the like. The memory 49 holds initial parameters and operating parameters of the wavelength tunable LD 100 in connection with target channels. The channel is the number corresponding to respective target wavelengths of the wavelength tunable LD 100. Specifically, one channel corresponds to one grid determined by ITU-T (International Telecommunication Union Telecommunication Standardization Sector).

The temperature controller 42, which controls a temperature of the wavelength tunable LD 100 and includes Peltier elements, is often called as a Thermoelectric cooler (TEC). The thermistor 43 indirectly senses the temperature of the wavelength tunable LD 100 through a temperature of the temperature controller 42. The wavelength tunable LD 100, the thermistor 43, the beam splitters 44 and 45, the PDs, 46 and 47, and the etalon filter 48 are mounted on the temperature controller 42.

The controller 41, referring to the thermistor 43, keeps a temperature of the temperature controller 42. The controller 41 provides the control signals, Sig1 and Sig2, in the segment SG1 and the segment SG2 of the wavelength tunable LD 100. Then, the laser oscillation occurs at the target wavelength depending on the control signals, Sig1 and Sig2, when the other control signal G is provided to the electrode 7.

The light output from the wavelength tunable LD 100 is divided by the beam splitter 44. One of split light enters the PD 46, while, another split light is divided again by the beam splitter 45. One of further split light enters the other PD 47 via the etalon filter 48, while, the rest pf split light is output externally. In the arrangement thus described, the PD 46 may detect the intensity of the light directly, or without through any optical components, of the wavelength tunable LD 100. On the other hand, the PD 47 may detect the intensity of the light passing through the etalon filter 48. The etalon filter 48 has an arrangement where two reflection mirrors or two semi-transparent mirrors face to each other with an interval.

The controller 41 controls the intensity of the light output from the wavelength tunable LD 100 by referring to the first PD 46. The controller 41 may keep the target wavelength referring to a ratio of the intensity of the light passing through the etalon filter 48, which is detected by the second PD 47, against the intensity of the light directly coming from the wavelength tunable LD 100. In the process to keep the target wavelength, the controller 41 controls the refractive index of the segment SG1 and/or that of the segment SG2. That is, when the ratio of two intensities each detected by the first PD 46 and the second PD 47 is offset from a value corresponding to the target wavelength, the control signal Sig1 supplied to the segment SG1 and the signal Sig2 to the segment SG2 are varied until the target ratio is obtained.

Until the operation to set the target wavelength is completed, the optical output is blocked by, for instance, a shutter. When the operation is completed, at which one of the peak wavelengths attributed to the segment SG1 coincided with one of the peak wavelengths attributed to the segment SG2. Then, the laser oscillation at the target wavelength is achieved. Opening the shutter, the light is output externally. The AFC function is continuously carried out even after the light is practically output externally by opening the shutter. An SOA (Semiconductor Optical Amplifier) integrated with the wavelength tunable LD 100 may be used as the shutter.

The control signals, PSG1 and PSG2, supplied to the segment SG1 and the segment SG2, respectively, are processed by digital-to-analog converts (D/A-C) included in the controller 41 corresponding to the segment SG1 and the segment SG2. In the controller 41, the D/A-Cs are asynchronously or sequentially operable. That is, the control of the segment SG1 and that of the segment SG2 are not simultaneously performed. Next considers a case where the AFC function is carried out after one of the peak wavelengths attributed to of the segment SG1 once coincides with one of the peak wavelengths attributed to the segment SG2.

As mentioned above, when the segments, SG1 and SG2, are not simultaneously controlled by the controller 41, the peaks coinciding with respective wavelengths may be possibly off from each other. This results in a hopping of the oscillation wavelength. Moreover, even when the controls of respective refractive indices in the segments, SG1 and SG2, are simultaneously performed, the matched peaks are possibly off from others when the variation of the refractive index in the segments, SG1 and SG2, against a unit stimulus is not identical. The current injection to modify the refractive index is locally and independently in respective segments, SG1 and SG2. Therefore, even if the current provided to the segments, SG1 and SG2, is simultaneously varied, the variation of the refractive index in the semiconductor material does not simultaneously appear. In particular, in an LD having a complicated structure to tune the oscillation wavelength thereof, the behaviors above described often encounter. When the control of the refractive index is thermally performed by a heater, heating is localized in a region where the heater is grounded. Therefore, the change of the refractive index is not identical in respective regions, SG1 and SG2. Accordingly, the peak wavelengths attributed to respective regions, which are once matched by the AFC function, are possibly off from each other.

Figure 3:
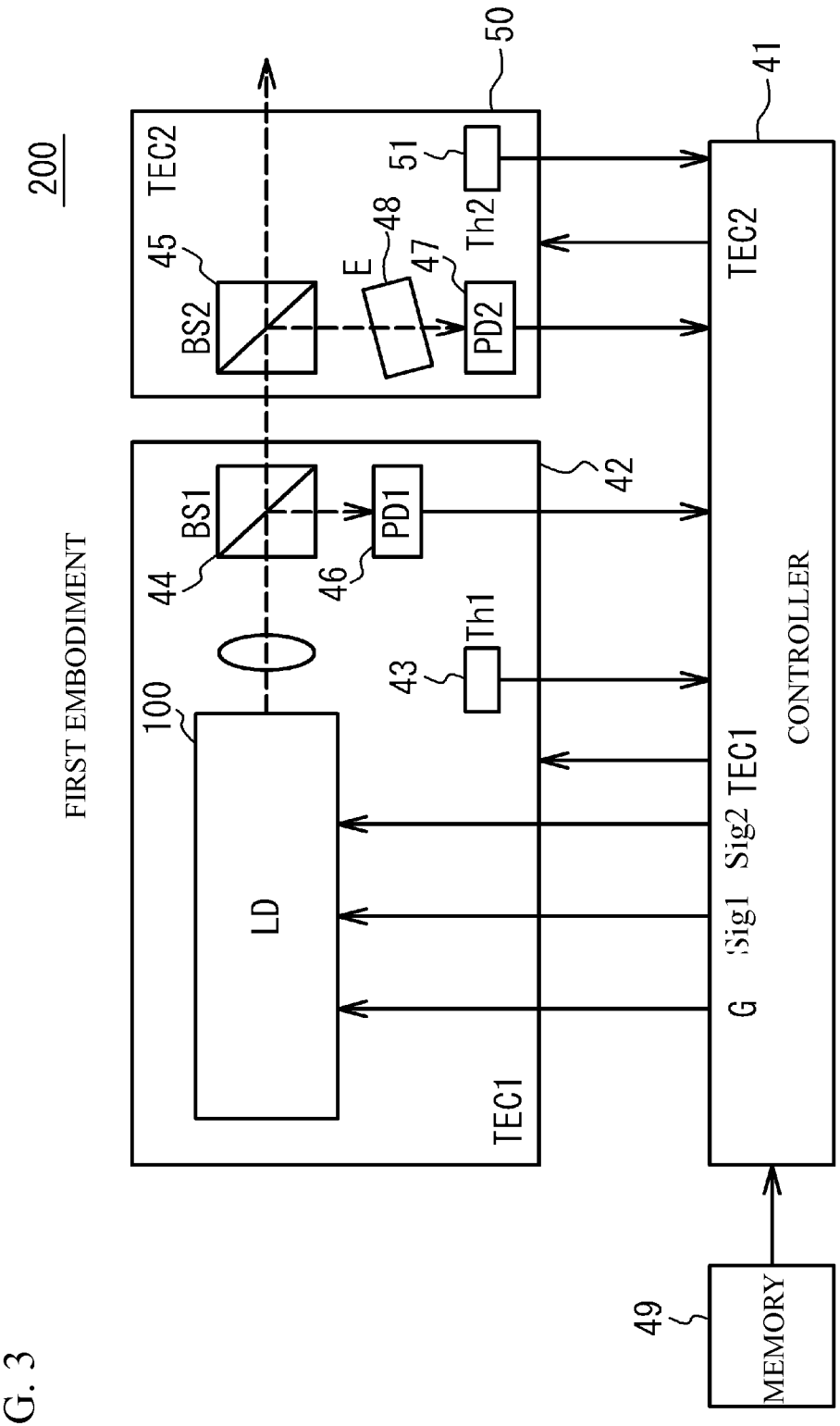
FIG. 3 illustrates a system of an apparatus for output light with a tunable wavelength in accordance with the first embodiment.

FIG. 3 illustrates an apparatus 200 to tune a oscillation wavelength of an LD 100 in accordance with the first embodiment. The embodiment performs the AFC function by controlling a temperature by the temperature controller 42 on which the LD 100 is mounted. The temperature controller 42 may uniformly change the temperature of the LD 100 because the temperature controller 42 mounts the whole part or the whole body of the LD 100.

In the embodiment shown in FIG. 3, another temperature controller 50 that mounts the etalon filter 48 thereof is provided in addition to the temperature controller 42 that mounts the wavelength tunable LD 100, which suppresses negative effects appearing in the case where only one temperature controller 42 performs the AFC function. That is, in the case shown in FIG. 2, the characteristics of the etalon filter 48 varies in accordance with the procedures of the AFC function. While, in the present embodiment shown in FIG. 3, the temperature of the etalon filter 48 is separately controlled independent of the control of the temperature of the wavelength tunable LD 100. The apparatus 200 has a thermistor 51 to sense the temperature of the temperature controller 50.

The etalon filter 48 in the temperature thereof is set in a condition necessary for the apparatus 200. That is, when further performance could be realized by controlling the characteristic of the etalon filter 48 in addition to the control to keep the temperature constant, which includes a condition to vary the temperature thereof, the change of the temperature is practical.

Figure 4:
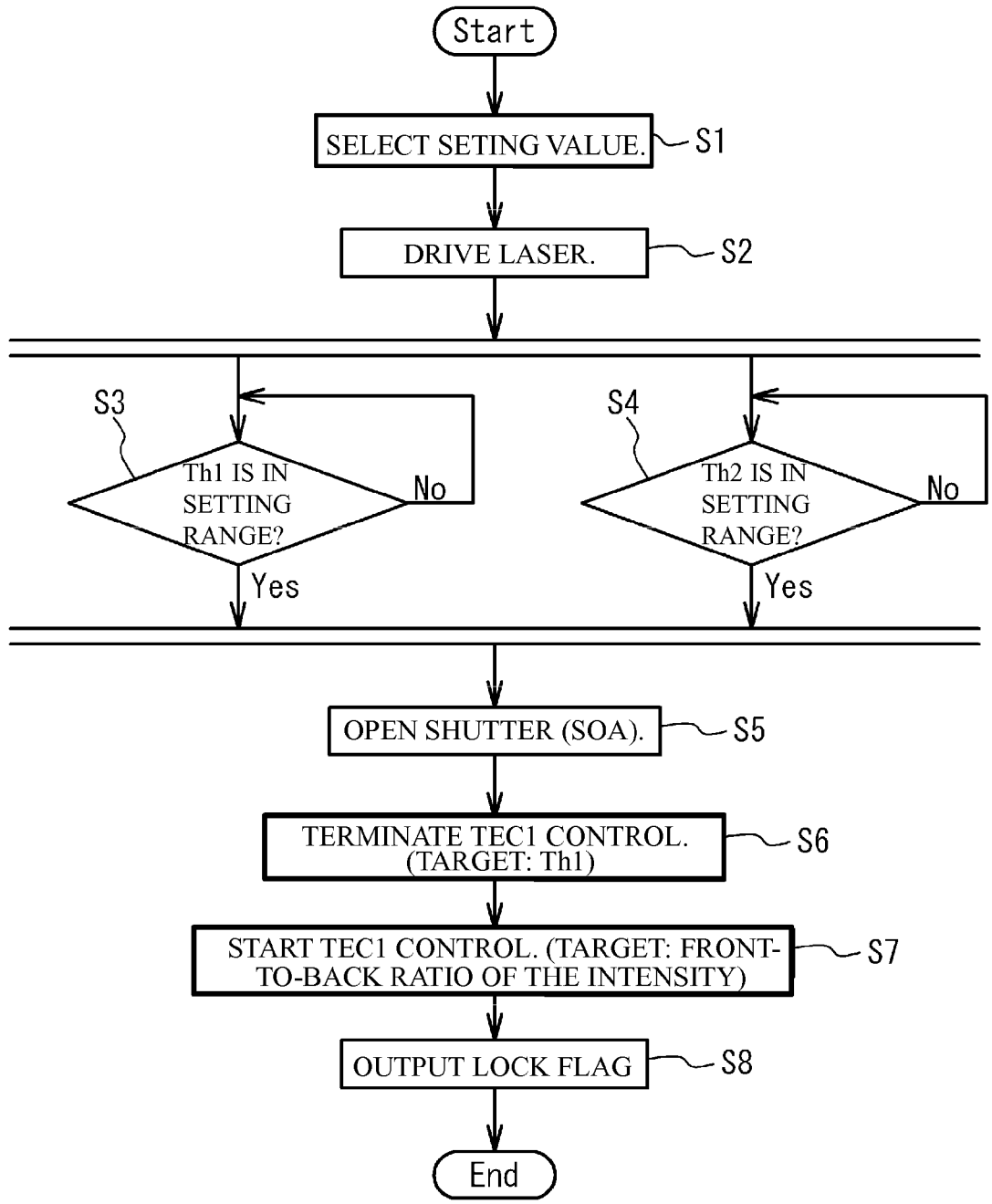
FIG. 4 illustrates an example of a flowchart of an AFC function with use of a temperature controller.

FIG. 4 illustrates an example of a flowchart of the AFC function using the temperature controller 42. As illustrated in FIG. 4, the controller 41 sets target values for the wavelength tunable LD 100, which are to be stored in the memory 49, corresponding to the target wavelengths (Step S1). Next, the controller 41 practically drives the wavelength tunable LD 100 based on thus set values. In this case, the peak wavelengths attributed to the segment SG1 and those attributed to the segment SG2 are controlled depending on the control signals, PSG1 and SG2, respectively (Step S2).

Next, the controller 41 checks whether the temperature Th1 monitored by the thermistor 43 is in a reset range (Step S3). When the temperature Th1 is out of the preset range, which corresponds to "No", the step S3 is executed again. The controller 41 also checks whether the temperature Th2 monitored by the thermistor 43 is in a preset range (Step S4). When the temperature Th2 is out of the preset range, which corresponds to "No", the step S4 is also executed again.

When the temperatures, Th1 and Th2, are both within respective preset ranges, which corresponds to "Yes" in the step S3 and the step S4, the controller 41 opens the shutter (Step S5). Next, the controller 41 terminates the control of the temperature controller 42 so as to set in the target temperature Th1 in step S6, then, the controller 41 starts the AFC function using the temperature controller 42 (Step S7). Specifically, the controller 41 calculates a ratio of two intensities each monitored by the PD 46 and the PD 47, and starts the control of the temperature controller 42. The control of the temperature may be flexible, that is, the control may refer only to the target value, or to a preset allowable range. The controller 41 sets a lock flag when the ratio of two intensities enters within the allowable range around the target value (Step S8).

FIG. 5 illustrates an example of a data table that holds parameters for performing the function above described. In FIG. 5, a parameter "IG" in the first column denotes a control signal G provided to the electrode 7 to control the gain. Parameters, "TTEC1" and "TTEC2", in the second and third columns are provided to the temperature controllers 42 and 50 to control the temperatures thereof. Parameters, "PSG1" and "PSG2", in fourth and fifth columns are control signals supplied to respective segments, SG1 and SG2. Parameter "Im1" is a target value of the PD 46, and a ratio "Im1/Im2" is a target ratio of two intensities of the PD 46 and the PD 47. The parameter "Im1" and the ratio "Im1/Im2" are target values in the feedback control.

As illustrated in FIG. 5, these parameters are prepared for respective target wavelengths. The target wavelengths are related to the oscillation wavelength of the wavelength tunable LD 100. The parameters are obtained by a wavelength meter in advance to a practical operation of the apparatus 200 and stored in the memory 49. In the example of FIG. 5, the target temperatures of the temperature controllers, 42 and 50, are invariant in respective wavelength channels. The control may be occasionally performed with a value different from those stored in the memory 49. The temperature of the temperature controller 42 may be offset from the target TTEC1 shown in FIG. 5 when the AFC function of the embodiment is carried out.

According to the first embodiment, the AFC function is performed by the temperature controller 42 that controls the temperature of the whole LD 100. Therefore, accuracy and stability of the AFC function may be achieved. Moreover, in the embodiment, the temperature controller 50 is provided in addition to and independent of the temperature controller 42. The temperature controller 50 controls the temperature of the etalon filter 48. The temperature of the etalon filter 48 is one of key factors for determining the wavelength characteristic of the etalon filter 48. The wavelength tunable LD 100 has the electrode 8 to control the refractive index of the first SG-DFB region A and that of the second SG-DFB region B. Accordingly, the temperature of the temperature controller 42 may be inherently kept constant; that is, the temperature controller 42 is unnecessary to control the temperature thereof to tune the wavelength. When the temperature of the temperature controller 42 is varied to modify the refractive index of semiconductor material, the wavelength characteristic of the etalon filter 48 is also modified by the temperature change of the temperature controller 42 in a case where the etalon filter 48 is commonly mounted on the temperature controller 42. In the embodiment, the etalon filter 48 is mounted on the other temperature controller 50 different from and independent of the temperature controller 42. It is, therefore, possible to suppress the change of the wavelength characteristic of the etalon filter 48 in accordance with the temperature change of the temperature controller 42.

Second Embodiment

In the first embodiment, the operation for outputting the light with a wavelength just on the wavelength channel or grid is described. In a second embodiment, the wavelength indicated by an external system is different from the wavelength channel by $\Delta F$, that is, the indicated wavelength is shifted from the wavelength channel stored in the memory 49 by an amount of $\Delta F$.

When the second embodiment is practically executed, the flowchart of FIG. 4 is also used. In the second embodiment, in the step S1 of FIG. 4, a calculation for changing the target value based on the offset $\Delta F$ with respect to the value stored in the memory 49 (the parameter of FIG. 5) is performed.

In the second embodiment, a calculation for changing the target values, PSG1 and PSG2, of the control signals, SiG1 and SiG2, is carried out. In typical procedures, wavelength coefficients, or wavelength derivatives, for changing the target values, PSG1 and PSG2, are estimated in advance, and modified target values for compensating the offset $\Delta F$ may be calculated from the wavelength coefficient/coefficient.

Also, a calculation for changing the target temperature TTEC2 for the temperature controller 50 is also performed. Setting the temperature of the temperature controller 50 deviating from the target temperature stored in the memory 49, the wavelength characteristic of the etalon filter 40 may be varied. A calculation for compensating the target temperature TTEC2 corresponding to the wavelength shift $\Delta F$ is carried out. When the external apparatus indicates a wavelength, which deviates from the wavelength channel by the amount of $\Delta F$; the modified or indicated target wavelength may be output by the feedback control to realize the ratio of two intensities "Im1/Im2" stored in the memory 49.

In the second embodiment, the apparatus 200 is controlled based on thus calculated target values. Also in the second embodiment, different from the first embodiment where two control signals, Sig1 and Sig2, performs the AFC function; only the temperature controller 42 carries out the AFC function. The AFC function with enough accuracy and superior stability may be achieved similar to the first embodiment.

Third Embodiment

The present embodiment has a feature that the AFC function is carried out based on the parameters held in the memory 49. FIG. 6 shows the architecture of the data table according to the third embodiment, which is similar to that shown in FIG. 5 but provides target temperatures TTEC1 for the temperature controller 42 depending on the target wavelengths.

The data table of FIG. 6, as already described in the first embodiment, holds parameters obtained by tuning them as using the wavelength meter in advance to the practical operation of the apparatus 200, where the parameters correspond to respective wavelength channels. The tune is carried out for modifying the refractive index in the first and second SG-DFB regions, A and B.

In the present embodiment, the tuning of the parameters includes the control of the temperature controller 42 in addition to two control signals, Sig1 and Sig2. Specifically, a first step varies two control signals, Sig1 and Sig2, until the oscillation wavelength becomes close to the target wavelength channel, which may be called as the rough tuning; then, controls the temperature controller 42 to coincide the oscillation wavelength with the target wavelength channel as fixing the control signals, Sig1 and Sig2. According to the procedures above described, the wavelength tuning may be simply carried out with enough accuracy and preferable stability.

Thus, the table shown in FIG. 6 provides the target temperatures TTEC1 for the temperature controller 42 in connection with respective wavelength channels. The target temperature for at least one wavelength channel may be different from those for other wavelength channels. All of the target temperatures TTEC1 may be different from others.

Fourth Embodiment

Figure 7:
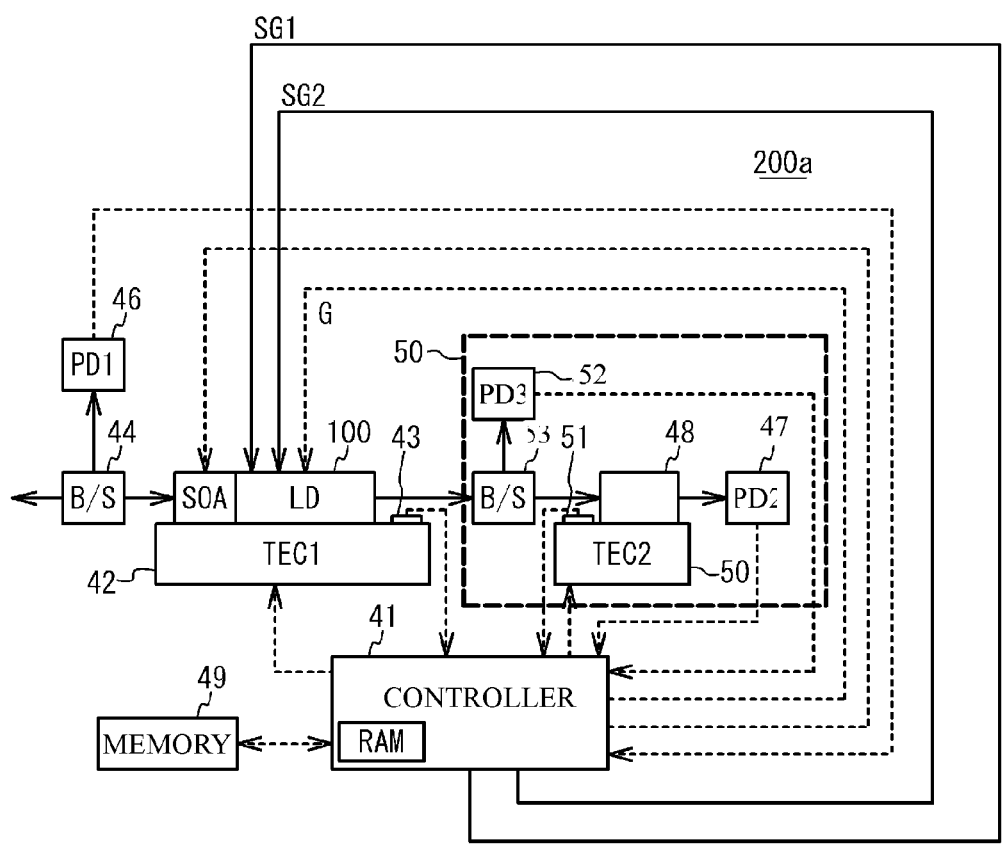
FIG. 7 illustrates a system of an apparatus for output light with a tunable wavelength in accordance with a fourth embodiment.

FIG. 7 is a block diagram of an apparatus 200a according to the fourth embodiment, where the apparatus 200a has the function of the tunable wavelength. The apparatus 400a provides the second temperature controller 50, which is different from and independent of the first temperature controller 42 that mounts the wavelength tunable LD 100, in the rear side. The wavelength tunable LD 100 also provides the SOA in the front side; accordingly, the apparatus 200a may shut the optical output until the operation of the wavelength tuning completes. In the apparatus 200a, the PD 46, which is placed in front of the SOA, monitors light split by the beam splitter 44 set also in front of the SOA as those in the previous embodiment; while, the second PD 47 is set behind the etalon filter 48. The apparatus 200a additionally provides the PD 52 that monitors light split by the splitter 53 placed in the rear side of the LD 100 but in front of the etalon filter 48.

Carrying out the AFC function in the present embodiment, the controller 41 adjusts the output power of the wavelength tunable LD 100 based on the output from the PD 46; while, the controller 41 keeps the oscillation wavelength of the wavelength tunable LD 100 based on the ratio of two intensities each detected by the PD 47 behind the etalon filter 48 and the last PD 52 in front of the etalon filter 48. The AFC operation by the controller 41 is carried out by the temperature controller 42 not two control signals, Sig1 and Sig2, until the ratio of two intensities based on two PDs, 47 and 52, becomes substantially equal to the target ratio.

The arrangement of the present embodiment may prevent the wavelength characteristic of the etalon filter 48 from fluctuating by the AFC operation performed by varying the temperature of the wavelength tunable LD 100. Moreover, the arrangement shown in FIG. 6 is possible to verify the oscillation wavelength without practically outputting the optical beam by opening the shutter.

The temperature of the etalon filter 48 may be optionally set in a value required in the apparatus 200a. That is, the etalon filter 48 permanently fixes the temperature thereof in the optional value, or in an alternative, the apparatus 200a may optionally vary the temperature of the etalon filter 48 depending on the application of the apparatus 200a.

Figure 8:
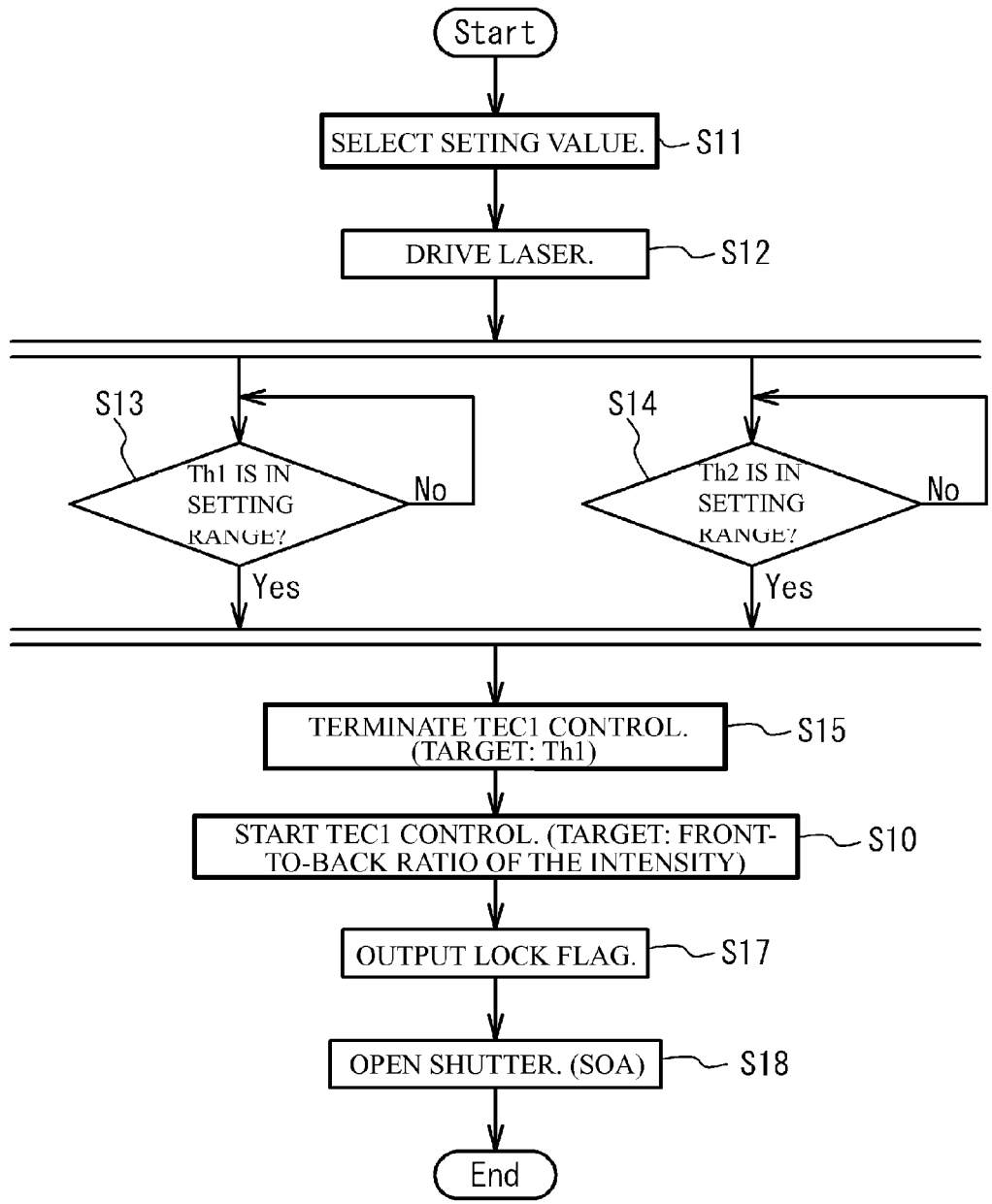
FIG. 8 illustrates an example of a flowchart of an AFC function with use of a temperature controller.

FIG. 8 illustrates an example of an algorithm of the AFC operation using the temperature controller 50 shown in FIG. 7. The controller 41 first provides the parameters in the wavelength tunable LD 100 at step S11; then, practically drives the LD 100 at step s12.

The controller 41 checks, at step s13, the temperature Th1 sensed by the thermistor 43 is within a preset range, and, concurrent with the step s13, the temperature Th2 sensed by the thermistor 51 is within a present range at step s14. When the temperatures, Th1 and Th2, are out of the preset range, the steps, s13 and s14, are iterated until the temperatures, Th1 and Th2, enters the present range.

When the temperatures, Th1 and Th2, are both within the present range, which corresponds to "Yes" in FIG. 8, the controller 41 completes the control for the temperature controller 42 at step s15; and begins the AFC operation for the controller 42 at step s16. In the AFC operation, the ratio of two intensities each monitored by the PDs, 47 and 52, respectively, enters a present range around the target ratio by controlling the temperature of the wavelength tunable LD 100. When the ratio is within the present range around the target ratio, the controller sets the flag at step S17 and opens the shutter at step S18. Thus, the procedures to tune the wavelength of the light output from the apparatus 200a are completed.

The process thus described performs the AFC operation by the temperature controller 42 that controls the temperature of the whole wavelength tunable LD 100, which effectively enhances not only the accuracy of the tuning of the oscillation wavelength but the stability of the operation itself. Also, the process controls the temperature of the etalon filter 48 separately from and independent of the temperature of the wavelength tunable LD 100, which also enhances the accuracy of the oscillation wavelength and the stability to keep the oscillation wavelength.

Figure 9:
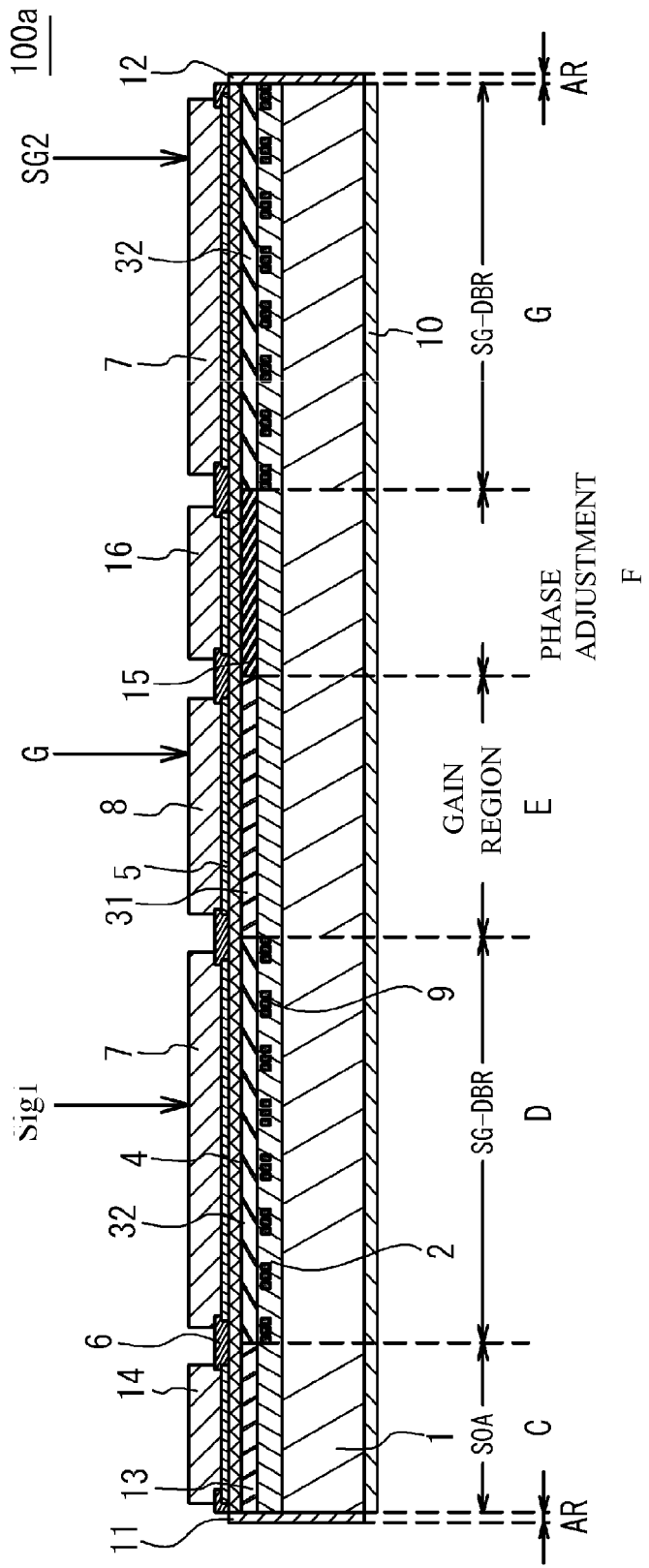
FIG. 9 illustrates a schematic cross sectional view of an overall structure of a semiconductor laser in accordance with a fifth embodiment.

The invention thus described does not restrict the wavelength tunable LD 100 in those illustrated in FIG. 1. For instance, FIG. 9 shows in a cross section thereof another wavelength tunable LD 100a applicable to the apparatuses, 100 and 100a. The wavelength tunable LD 100a provides the SOA region C, a sampled grating distributed Bragg reflector (SG-DBR) region D, a gain region E, a region F for adjusting the phase, another SG-DBR region G, and AR films AR.

These regions and films are arranged from the front side to the rear side in this order. The SOA region C operates as an optical amplifier. Two SG-DBR regions, D and G, provide the sampled gratings but show no optical gain.

Both of the SG-FBR regions, D and G, provide on the substrate 1 the lower cladding layer 2, the tuning region 32, the upper cladding layer 4, the contact layer 5 and the electrode 7. The gain region E includes also on the substrate 1 the lower cladding layer 2, the gain region 31, the upper cladding layer 4, the contract layer 5, and the electrode 8. The SOA region C includes the lower cladding layer 2, an amplifying layer 13, the contact layer 5 and an electrode 14. The region F for adjusting phase includes the lower cladding layer 2, a waveguide layer 15, the contact layer 5, and an electrode 16. The facet of the SOA region C, which exposes the lower cladding layer 2, the amplifying layer 13, and the upper cladding layer 4, provides the AR film 11. That is, the AR film 11 covers the front facet of the wavelength tunable LD 100a. Another facet provided in the SG-DBR region G, which exposes the substrate 1, the lower cladding layer 2, the tuning region 32, and the upper cladding layer 4, provides another AR film 12. That is, the AR film 12 covers the rear facet of the wavelength tunable LD 100a.

The SOA region C, the SG-DBR regions, D and G, the gain region E, and the region F to adjust the phase commonly provide the substrate 1, the lower cladding layer 2, and the upper cladding layer 4. That is, the substrate 1, the lower cladding layer 2, and the upper cladding layer 4 extend in the SOA region C, the SG-DBR regions, D and G, the gain region E, and the region F to adjust the phase. Also, the gain region 31, the tuning region 32, the amplifying layer 13, and the waveguide layer 15 horizontally extend on a same level. That is, the gain region 31, the tuning region 32, the amplifying layer 13, and the waveguide layer 15 have thickness substantially same with each other.

The lower and upper cladding layers, 2 and 4, form the optical confinement structure with respect to the gain regions 31, the tuning region 32, the amplifying layer 13, and the waveguide layer 15 in the gain region E, the SG-DBR regions, D and G, the SOA region C, and the region F to adjust the phase, respectively. The amplifying layer 13 shows an optical gain injected with carries from the electrode 14 to show the function of the optical amplifier. The amplifying layer 13 may have the MQW structure including well layers each made of $Ga_{0.35}In_{0.65}As_{0.99}P_{0.01}$ with a thickness of 5 nm and barrier layers each made of $Ga_{0.15}In_{0.85}As_{0.32}P_{0.68}$ with a thickness of 10 nm, where they are alternately stacked. In an alternate, the amplifying layer 13 may have a bulk structure made of $Ga_{0.44}In_{0.56}As_{0.95}P_{0.95}$. The waveguide layer 15 may be made of $Ga_{0.28}In_{0.72}As_{0.61}P_{0.39}$ with the function of varying the refractive index thereof by injecting carries from the electrode 16. The SG-DBR regions, D and G, in the lower cladding layer 2 thereof provide the diffraction gratings 9 discretely formed with a preset distance.

The segments Sg1 in the SG-DBR region D each has an optical length substantially same as that of other segments. Also, the segment Sg2 in the SG-DBR region G each has an optical length substantially same as that of other segments but different from the optical length of the segments in the other SG-DBR region D. The control signals, Sig1 and Sig2, provided to electrodes 8 in respective SG-DBR regions, D and G, may modify the refractive index of the segments, which resultantly modifies the peak wavelengths attributed to the SG-DBR region D and that attributed to the other SG-DBR region G. The laser oscillation occurs at the wavelength where one of the peak wavelengths attributed to the SG-DBR region D coincides with one of the peak wavelengths attributed to the other SG-DBR region G. The other control signal G provided to the electrode in the gain region E controls the optical gain of the wavelength tunable LD 100a.

When the wavelength tunable LD 100a is installed in the apparatus 200, the accuracy of the AFC operation and the stability thereof may be enhanced because the AFC operation is carried out by controlling the temperature of the LD 100a. In addition, when the control of the temperature of the etalon filter 48 is carried out separately from and independent of the control of the laser temperature, the accuracy and the stability of the AFC operation may be further enhanced.

In the embodiments thus described, the current injection to the tuning region 32 and the waveguide layer modifies the refractive index thereof. However, techniques to modify the refractive index are not restricted to the current injection. The modification of the refractive index may be thermally realized by local heaters to vary the temperature of the tuning region and that of the waveguide locally.

The present invention is not limited to the specifically disclosed embodiments and variations but may include other embodiments and variations without departing from the scope of the present invention.

What is claimed is:

1. An apparatus for output light with a wavelength tunable function, comprising:
    a semiconductor laser diode (LD) including:
        regions to determine an oscillation wavelength, each region including a diffraction grating and an electrode to control a refractive index of that region; and
        at least one gain electrode disposed between the electrode of one of the regions and the electrode of another of the regions;
    a first temperature controller for mounting the LD thereon to control a temperature of the LD;
    a unit to detect the oscillation wavelength;
    a second temperature controller that mounts the unit and is separated from and independent of the first temperature controller; and
    a controller configured to vary the respective refractive indices of the regions by providing control signals to the electrodes to oscillate the LD and after that providing another control signal to the first temperature controller for varying the temperature of the LD to coincide the oscillation wavelength with a target wavelength based on the oscillation wavelength detected by the unit.

2. The apparatus as claimed in claim 1, wherein the first temperature controller sets the temperature thereof in constant when the control signals are supplied to respective electrodes.

3. The apparatus as claimed in claim 1, wherein the LD provides two or more of the regions to determine the oscillation wavelength, wherein each region has reflection spectrum or gain spectrum including a plurality of peaks, and wherein the control signals coincide one of peaks in one of the regions with one of peaks in other regions.

4. The apparatus as claimed in claim 3, wherein the first temperature controller varies the temperature of the LD as maintaining a combination of the one of peaks in one of the regions with the one of peaks in other regions.

5. The apparatus as claimed in claim 1, wherein the unit comprises an etalon filter mounted on the second temperature controller, the controller determining the oscillation wavelength based on an intensity of light passing through the etalon filter, wherein the controller provides the another control signal supplied to the first temperature controller to set the intensity substantially equal to a target intensity corresponding to the target wavelength.

6. The apparatus as claimed in claim 1, wherein at least one of the regions provides a heater to control the refractive index of the at least one of the regions, wherein the electrode in the at least one of the regions is connected to the heater to control a temperature of the at least one of the regions or injects carriers into rest of the regions to control the refractive index of the rest of the regions.

7. A method to determine an oscillation wavelength of a wavelength tunable laser diode (LD) that includes regions having respective diffraction gratings therein and respective electrodes on the regions, each region including a diffraction grating and an electrode, the regions showing spectra specific thereto including a plurality of peaks, and the LD also including at least one gain electrode disposed between the electrode of one of the regions and the electrode of another of the regions, the method comprising steps of:
    providing control signals to respective electrodes to determine an oscillation wavelength at which one of peaks of one of regions coincides with one of peaks of another of regions; and
    after that, providing another control signal to a first temperature controller that mounts the wavelength tunable LD thereon, the another control signal varying a temperature of the LD such that the oscillation wavelength of the wavelength tunable LD becomes substantially equal to a target wavelength based on the oscillation wavelength detected by a unit to detect the oscillation wavelength that is mounted on a second temperature controller separated from and independent of the first temperature controller.

8. The method of claim 7, wherein the step of providing the controls signals is carried out under a condition where the first temperature controller sets the temperature of the LD invariant.

9. The method of claim 7, wherein the step of providing the another control signal maintains a combination of one of peaks of one of regions with one of peaks of another of regions.

10. The method of claim 7, wherein at least one of signals varies a temperature of one of regions receiving the at least one of signals.

11. The method of claim 7, wherein at least one of signals injects carries into one of regions receiving the at least one of signals.

12. The method of claim 7, wherein the step of providing the another control signal refers an intensity of light output from the wavelength tunable LD through an etalon filter mounted on the second temperature controller.

13. The method of claim 12, wherein the second temperature controller maintains a temperature thereof independent of the temperature of the wavelength tunable LD.

* * * * *